United States Patent [19]
Dolan et al.

[11] Patent Number: 5,757,130
[45] Date of Patent: May 26, 1998

[54] LAMP WITH ELECTRODES FOR INCREASED LONGEVITY

[75] Inventors: James T. Dolan, Frederick; Michael G. Ury, Bethesda; Charles H. Wood, Rockville, all of Md.; John F. Waymouth, Marblehead, Mass.

[73] Assignee: Fusion Lighting, Inc., Rockville, Md.

[21] Appl. No.: 483,526

[22] Filed: Jun. 7, 1995

Related U.S. Application Data

[63] Continuation of Ser. No. 353,321, Dec. 5, 1994, which is a continuation-in-part of Ser. No. 71,027, Jun. 3, 1993, Pat. No. 5,404,076, which is a continuation of Ser. No. 604,487, Oct. 25, 1990, abandoned, and a continuation-in-part of Ser. No. 149,818, Nov. 10, 1993, which is a continuation of Ser. No. 60,553, May 13, 1993, abandoned, which is a continuation-in-part of Ser. No. 875,769, Apr. 29, 1992, abandoned, Ser. No. 882,409, May 13, 1992, abandoned, Ser. No. 867,551, Apr. 13, 1992, abandoned, and Ser. No. 60,556, May 13, 1993, abandoned, which is a continuation-in-part of Ser. No. 882,410, May 13, 1992, abandoned, which is a continuation-in-part of Ser. No. 779,718, Oct. 23, 1991, abandoned, which is a continuation-in-part of Ser. No. 604,487, Oct. 25, 1990, abandoned.

[51] Int. Cl.$^6$ ............................. H01J 17/20; H01J 61/12
[52] U.S. Cl. ..................... 313/574; 313/630; 313/631; 313/345; 313/346 R; 313/355; 313/491; 313/633
[58] Field of Search ............................ 313/570, 574, 313/630, 631, 632, 638, 642, 345, 346 R, 355, 356, 491, 311, 633

[56] References Cited

U.S. PATENT DOCUMENTS

| | | | |
|---|---|---|---|
| 3,427,492 | 2/1969 | Mizuno et al. | 313/345 X |
| 3,644,774 | 2/1972 | Hunsaker et al. | 313/325 |
| 4,005,325 | 1/1977 | Suga | 313/355 X |
| 4,039,883 | 8/1977 | Damsteeg et al. | 313/633 |
| 4,574,219 | 3/1986 | Danevport et al. | 313/633 X |
| 4,864,191 | 9/1989 | Van De Weijet et al. | 313/576 X |
| 4,973,880 | 11/1990 | Honda et al. | 313/633 |
| 5,004,951 | 4/1991 | Honda et al. | 313/633 X |
| 5,404,076 | 4/1995 | Dolan et al. | 313/572 |

FOREIGN PATENT DOCUMENTS

| | | | |
|---|---|---|---|
| 0168328 | 12/1981 | Japan | 313/345 |
| 0257058 | 12/1985 | Japan | |
| 0257061 | 12/1985 | Japan | |
| 0258842 | 12/1985 | Japan | |
| 0262371 | 11/1987 | Japan | |
| 0266006 | 11/1987 | Japan | |

*Primary Examiner*—Ashok Patel
*Attorney, Agent, or Firm*—Pollock, Vande Sande & Priddy

[57] ABSTRACT

A lamp for emitting in the visible portion of the spectrum, which utilizes a fill which includes a selenium and/or a sulfur containing substance. The lamp has superior performance characteristics. Special electrode structures are provided which enhance longevity.

10 Claims, 7 Drawing Sheets

LAMP WITH ELECTRODES FOR INCREASED LONGEVITY

The present application is a continuation of U.S. application Ser. No. 353,321, filed Dec. 5, 1994, which is a continuation-in-part of application Ser. No. 08/071,027, filed Jun. 3, 1993, now U.S. Pat. No. 5,404,076 which is a continuation of application Ser. No. 07/604,487, filed Oct. 25, 1990, now abandoned; and a continuation-in-part of application Ser. No. 08/149,818, filed Nov. 10, 1993, now allowed, which is a continuation of application Ser. No. 08/060,553, filed May 13, 1993, now abandoned, which is a continuation-in-part of application Ser. No. 07/875,769, filed Apr. 29, 1992, now abandoned, application Ser. No. 07/882,409, filed May 13, 1992, now abandoned, and application Ser. No. 07/867,551, filed Apr. 13, 1992, now abandoned; and a continuation-in-part of application Ser. No. 08/060,556, filed May 13, 1993, now abandoned, which is a continuation-in-part of application Ser. No. 07/882,410, filed May 13, 1992, now abandoned, which is a continuation-in-part of application Ser. No. 07/779,718, filed Oct. 23, 1991, now abandoned, which is a continuation-in-part of application Ser. No. 07/604,487, filed Oct. 25, 1990, now abandoned.

The present invention is directed to a new, high power lamp.

High power lamps are used for many illumination applications. The incandescent and fluorescent lamps, so familiar in homes and offices, do not provide enough illumination for many commercial and industrial applications. In fact, the lamp which has gained acceptance and which is typically used for high power illumination is known as the high intensity discharge (HID) lamp. This lamp is simple in structure, and generally consists of a glass envelope which contains two electrodes and a fill which vaporizes and becomes a gas when the lamp is operated.

The fill in the HID lamp usually contains mercury as its primary component. However, this is undesirable because mercury is a highly toxic and environmentally hazardous substance. Thus, if a HID lamp should break, dangerous mercury fumes would be emitted, and after the useful life of the lamp is over, there is no easy way to safely dispose of the mercury containing envelope. The widespread use of mercury containing lamps has been recognized as a serious environmental problem.

It is a feature of the present invention that instead of mercury, a substance which contains sulfur or selenium is used in the lamp fill.

In accordance with a first aspect of the present invention, elemental sulfur or selenium, or compounds of these elements, is included in a lamp fill. The fill is present at a pressure of at least about 1 atmosphere, and is excited with electromagnetic energy at a relatively high power density. Each of the above-mentioned substances has a low vapor pressure at room temperature, yet a high vapor pressure at typical lamp operating temperatures.

In accordance with a further aspect of the invention, elemental sulfur or selenium, or compounds of these elements are used as the primary radiating component of a lamp fill. The term "primary radiating component" as used herein means that radiating component of the fill which emits the largest part of the radiant energy emitted from the lamp during operation of the lamp, or that radiating component which is the sole radiating component in the fill.

There are many ways to measure how good a lamp is, and amongst those skilled in the lamp art the use of various standardized performance indicators has arisen. These include the luminous efficacy of the lamp, its rated life, lumen maintenance, chromaticity, and color rendering index (CRI). Finally, the stability of the color of the light which is emitted by the lamp is important, as this may change over time. The closer these accepted indicators are to ideal, the better the performance of the lamp.

As described above, the lamp of the invention is capable of avoiding the environmental hazards which are associated with mercury based lamps, and additionally the resultant performance indicators for the lamp are relatively good.

In a first embodiment of the invention, a high power lamp of the electrodeless type is provided, which is powered by microwave energy. High power electrodeless lamps are well known in the art, but have generally, if not always, contained a mercury fill. Additionally, the lamps have primarily been used for their output in the ultraviolet rather than the visible portion of the spectrum. In the electrodeless lamp of the invention, a high pressure fill at least as high about an atmosphere is utilized, which includes sulfur or selenium, or a compound thereof. Additionally, the fill may include an inert gas such as argon or xenon. The high pressure fill is excited at power densities in excess of 50 watts/cc, and preferably in excess of 100 watts/cc. Furthermore, various additives such as metal halides, arsenic, boron, etc., may be included in the fill to emphasize different areas of the spectrum.

The efficiency of production of useful radiation of the lamp of the invention is relatively high. In fact, it is significantly higher than for the conventional electrodeless lamp which utilizes a mercury fill. The ability to provide such a lamp is an unexpected result, as the fill substances used in accordance with the invention are lighter than mercury and form stable molecules at the wall temperature, so that they would be expected to have a higher heat conductivity than that of mercury so that it would be expected that more heat would be lost to the bulb walls, and that the efficiency of production of useful radiation would be lower than with the mercury lamp.

Additionally, the lamp of the invention has a low output in the infrared portion of the spectrum, which is particularly advantageous in applications where the emission of too much heat is a problem, for example in theater lighting, in the irradiation of plants, and when used with plastic optics, which may melt. Furthermore, the lamp has a well defined source geometry, since the electrodeless discharge tends to hug the lamp wall, is dimmable, has a relatively low flicker, is capable of good collimation for its power, and the fill is low pressure when turned off. The electrodeless lamp implementation exhibits a relatively long lifetime, and tends to maintain a uniform spectral output over lifetime. It also exhibits rapid starting and rapid restrike.

In a further embodiment of the invention, an arc lamp which has electrodes is provided. This is similar to the previously described mercury containing HID lamp, but instead of mercury, the fill includes a sulfur or selenium containing substance. As in the case of the electrodeless lamp, the addition of substances to the fill may be used to emphasize particular spectral regions. For example, sodium might be used to increase the orange and red radiation from the lamp.

In the prior art, low pressure, low power lamps are known which have been used in the laboratory for the scientific study of the spectrum (atomic spectroscopy). It is conventional in such laboratory work to use each of the elements of the periodic table, including the fill substances proposed herein, as the fill for electrodeless and arc lamps, so as to generate the atomic and molecular spectra of such elements. However, such lamps would be wholly unsuitable as high power visible, illumination sources. In fact, when the spectra generated with the lamps of the present invention were compared with the atomic or molecular spectrum generated by the low power, low pressure atomic spectroscopy lamps using the same fill, it was noted that for at least some implementations of the present invention, the ultraviolet part of the spectrum which appeared prominently in the spectrum of the atomic spectroscopy source was substantially and unexpectedly suppressed in the lamp of the invention, thus resulting in higher luminous efficacy, and in the generation of less harmful ultraviolet radiation.

It is thus an advantage of the present invention that a new, high power lamp is provided which does not need to contain mercury.

It is a further advantage of the invention that a new, high power lamp bulb is provided which does not need to contain mercury.

It is a further advantage of the invention that a new high power lamp is provided which has relatively good performance indicators of the type discussed above and/or other performance indicators.

The invention will be better appreciated by referring to the accompanying drawings, wherein.

Figure 1:
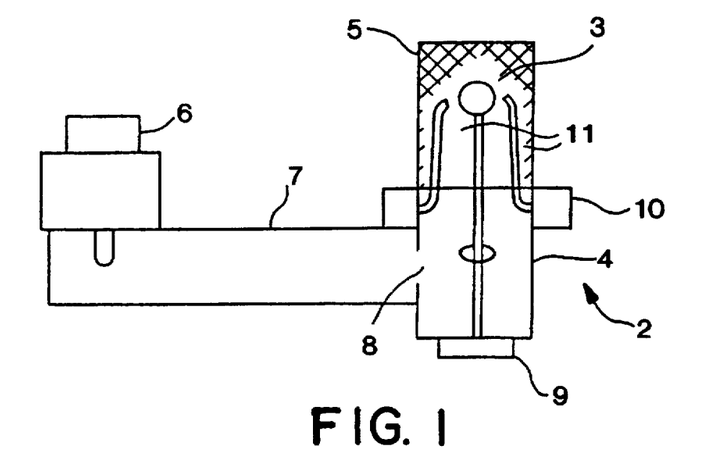
FIGS. 1 to 7 show various embodiments of the invention.

Referring to FIG. 1, a first embodiment of the invention is depicted. Lamp 2 is an electrodeless lamp which is powered by microwave energy. Bulb 3, contains a high pressure fill while operating, and is made of quartz or other suitable material and, is supported in a microwave cavity, which is comprised of conductive housing 4 and mesh 5. Magnetron 6 generates microwave energy, which is fed by waveguide 7, to coupling slot 8 of the microwave cavity.

This excites the bulb fill to a plasma state, whereupon light is emitted by the fill, which is transmitted out of the cavity through mesh 5. The mesh is metallic, and is constructed so that it is substantially opaque to microwave energy, while being substantially transparent to the light which is emitted by bulb 3. The bulb is rotated by rotator 9, and the bulb envelope is cooled by gas which is fed in to plenum 10 and out through nozzles 11.

While only one magnetron is shown in FIG. 1, the cavity may be fed by two magnetrons, which would be spatially displaced 90° from each other. The $TE_{111}$ mode may be used, and the bulb may be rotated at 300 RPM or higher.

In accordance with an aspect of the invention, the fill in the bulb includes elemental sulfur or selenium, or a compound of one of these elements. In accordance with a further aspect of the invention, this substance is present as the primary radiating component of the bulb fill. It is further desirable to use a fill component which aids in starting the discharge, and for example, a small amount of an inert gas, such as argon or xenon may be used for this purpose.

The lamp which is shown in FIG. 1 may be characterized as a high power, high pressure lamp. Thus, the fill in the bulb is present in amounts such that the fill pressure is at least about one atmosphere or above at operating temperature, and is preferably 2 to 20 atmospheres. Additionally, the amplitude of the microwave energy which is fed to the cavity is such that the power density of the energy which is coupled to the fill is at least 50 watts/cc, and preferably greater than 100 watts/cc. The maximum power density which can be used is in part a function of bulb cooling, and with present technology, it is anticipated that power densities of at least a few hundred watts/cc may be used. It should be understood that in the term "power density", the volume (cc) refers to the volume of light emitting gas rather than to the volume of the bulb. It should be further understood that the absolute amount of the primary fill component in solid form which is used in the bulb may vary depending on which substance is used, e.g., sulfur or selenium, but the amount always will be such to produce the desired pressure range at operating temperature, i.e., the temperature of the bulb during normal operation at a power density of 50 watts/cc or greater. The fill pressure is mainly controlled by the primary fill component, which typically has a substantially higher partial pressure than that of the inert gas when the lamp is operational. Further, the illumination provided by the lamp shown in FIG. 1 may be augmented in various regions of the spectrum by including certain additives in the fill. By way of non-limitative examples such additives may include metal halides, arsenic, and bismuth. Examples of some of the many metal halides which can be used are $CdI_2$, $HgCl$, and $InI_3$. Also, in certain implementations, the addition of some mercury may improve operation by reducing the restrike time of the lamp.

As noted above, in addition to using sulfur and selenium in elemental form, compounds of these elements may be used. For example, $InS$, $As_2S_3$, $CS_2$, $SeO_2$, $SeCl_4$ and $HgSe$, as well as other compounds of sulfur and selenium, may be used. The term "a sulfur containing substance" as used herein, includes both elemental sulfur and sulfur compounds, while the same is true for the corresponding terms as applied to selenium. It should be appreciated that the primary radiating component of the fill may be comprised of a combination of a sulfur containing substance and a selenium containing substance, rather than only one of these substances. Additionally, the primary radiating component may be comprised of a mixture of the elemental form and a compound(s) of a particular substance or substances.

Figure 2:
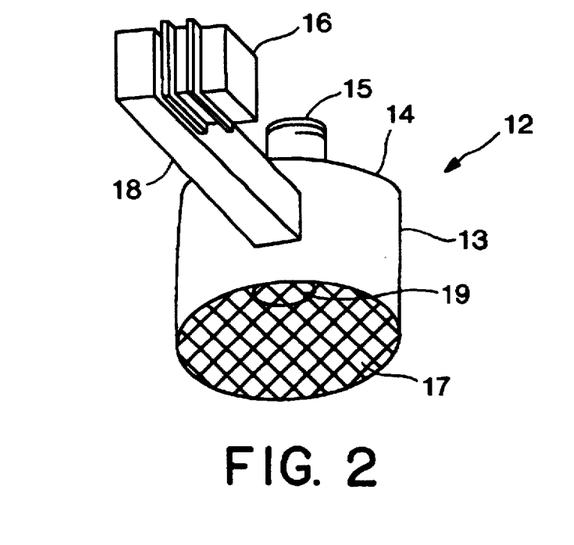

Further specific examples of lamps in accordance with the invention are shown in FIGS. 2 to 7. In FIG. 2, lamp 12 includes a cavity which is comprised of solid metallic cylindrical member 13, and mesh 17. Microwave power is provided by magnetron 16, which is coupled through waveguide 18 to a slot in member 13, so as to enter the cavity, and excite the fill in bulb 19, while the bulb is rotated by motor 15. The microwave mode which is coupled may be the $TE_{112}$ mode, and rotation may be at 900 RPM or higher.

Figure 3:
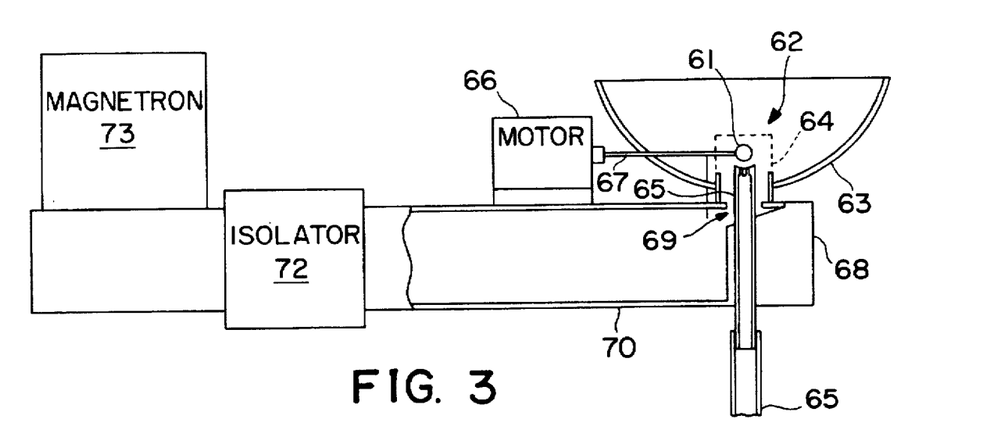
Figure 4:
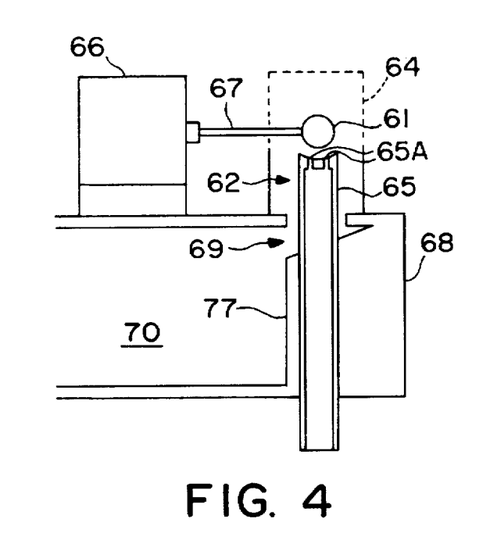
Figure 5:
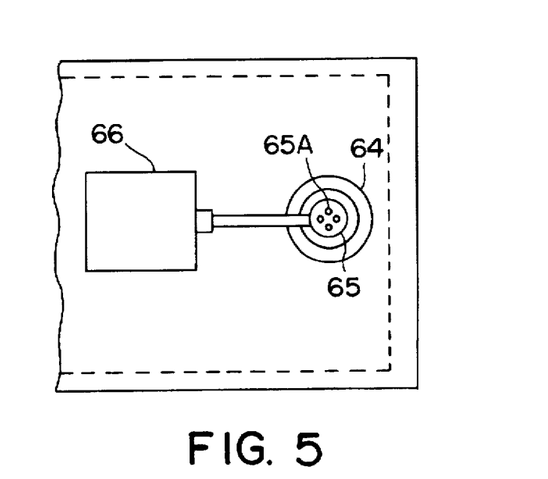

FIGS. 3 to 5 show a further embodiment of the invention, wherein the lamp is coaxially fed.

Referring to FIG. 3, the electrodeless lamp bulb 61 is excited by microwave electromagnetic energy which exits a coaxial transmission line structure 62 having a center conductor 65 and an outer conductor 64. The coaxial transmission line structure is coupled to a waveguide 70. The waveguide 70 is in turn connected through an isolator 72 to a magnetron 73.

Light from the electrodeless lamp 61 passes through the transparent outer conductor structure 64 which may be a cylindrically-formed wire mesh, and is incident to a reflector 63. The reflector 63 has an aperture co-extensive with the entrance aperture of the optical system, for example, of a projection television.

The magnetron 73 has a frequency in the ISM microwave band which is centered at 2450 MHz. An isolator 72 effectively isolates any energy reflected from the waveguide section 70 which may shift the frequency of operation of magnetron 73 away from a nominal frequency. As the waveguide 70 is matched in a particular frequency range to deliver maximum microwave power to the bulb 61, any frequency tolerance associated with the magnetron 73 could result in a reflection sufficiently large being returned from waveguide 70 such that the frequency of the magnetron 73 is pulled from its nominal frequency further increasing the size of the reflection. Increases in reflected energy consequently reduce the amount of energy delivered to a load.

Instead of isolator 72, an alternate means of stabilizing the magnetron may be provided, such as broadband or frequency selective attenuation. For example, a thin block of magnetic absorbing material located ¼ wavelength from the alcove will reduce the standing wave ratio and the probability of unwanted oscillation in the magnetron.

The coupling of electromagnetic energy from the waveguide 70 to the electrodeless lamp 61 is provided by a transmission line structure comprising a center conductor 65 and outer conductor 64. The center conductor 65 passes through an opening in the waveguide 70 into a coupling chamber 69 defined as an alcove formed at the end of the waveguide 70. The section of center conductor 64 which is exposed in the alcove 69 forms a coupling loop. The alcove 69 is shaped to provide for an impedance match between the coaxial transmission line defined by center conductor 65 and outer conductor 64 to the waveguide 70. The waveguide 70 is terminated at the second end by a short 68.

The center conductor 65 is hollow and exits the waveguide through a clearance hole, spaced from the upper wall of the waveguide 70 to avoid arcing therewith. The other end of the center conductor 65 extends through the partition 76, defining the alcove, and exits through the opposite side of the waveguide 70.

The hollow center conductor 65 is connected to a source of compressed air 75 and supplies cooling air to the surface of the electrodeless lamp 61. The microwave circuit, comprising the waveguide 70, alcove 69 and coaxial transmission line 62 couples the magnetron-produced microwave energy to the electrodeless bulb 61, causing it to emit high-intensity white light.

The outer conductor 64 of the coaxial transmission line 62 is transparent to light and, in a preferred embodiment, comprises a mesh conductor, terminating on the upper wall of waveguide 70, extending above the electrodeless lamp 61. The outer conductor 64 mesh extends above the electrodeless lamp 61 to shield significant levels of radio frequency energy from being radiated by the transmission line.

FIG. 4 illustrates in greater detail the structure of the coupling device connecting microwave waveguide 70 and transmission line 62. The alcove 69 is formed by an alcove partition 77 which occludes a major portion of the area of the waveguide 70. The alcove 69, in the preferred embodiment, is shown as a wedge-shaped alcove having an entrance aperture, and which decreases in area in the direction of the short circuited waveguide end 68. An apertured surface is provided on the end of center conductor 65, creating a stream of air for cooling the electrodeless lamp 61. The apertured surface is curved and has a center of curvature common to the electrodeless lamp 61 center of curvature. This provides a constant distance between the end of the center conductor and the surface of electrodeless lamp 61.

Since there is little RF electric field in the alcove 69, the RF magnetic field filling the space is constant, and equal to the value of the field tangent to the end of the waveguide 70. The coupling loop, excited by this field, is bounded by the middle of the center conductor 65, the upper waveguide wall and the alcove partition 77, and has a typical area of 50 square millimeters. Such a small loop couples effectively only to low impedances. The coupling from the waveguide to the coaxial transmission line would provide a voltage reflection coefficient in the waveguide greater than 0.8 if the coaxial transmission line was terminated in its own characteristic impedance, instead of the electrodeless lamp. A conventional coupling loop for joining the waveguide to the characteristic impedance of a coaxial line, typically 50 Ohms., would have about 10 times more area.

In the preferred embodiment, the bulb has an inside diameter of 6 mm, and is filled with 0.6 mg of sulfur and 150 torr of argon. The power applied is 250 microwave watts, and during operation, the bulb is rotated by motor 66 and stem 67 at speeds in excess of 8000 RPM.

FIGS. 4 and 5 show the apertures 65A (four apertures shown) in the end of the center conductor for feeding the cooling air. A use for the embodiment of FIGS. 3 to 5 is for projection sources, for example which would be employed in high definition television.

While microwave energy is the preferred mode of excitation for the lamps of the invention, it would also be possible to provide excitation with electromagnetic energy in the radio frequency range. Arrangements for effecting r.f. excitation of lamps are well known to those skilled in the art. Thus, the term "electromagnetic energy", as used herein, refers to both microwave and r.f. modes.

Figure 6:
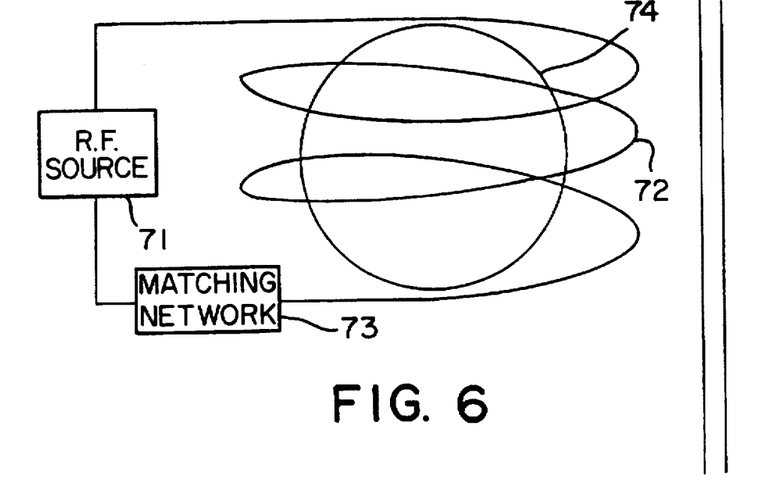

FIG. 6 is illustrative of a lamp which is powered by r.f. R.f. power from r.f. source 71 is fed to excitation coil 72 through impedance matching means 73. The excitation coil inductively couples the r.f. power to the fill in bulb 74.

It has been found that selenium provides advantageous operation as compared with sulfur in the embodiment of FIG. 6. It is believed that the higher conductivity of selenium affords more stable operation in the inductively coupled mode.

It is also believed that it may be possible to effectively operate an inductively coupled lamp using selenium without rotating the bulb. This may be because, in addition to its higher conductivity, selenium is less likely than sulfur to form allotropes. Such allotropes result in a fill density gradient through the bulb, which is obviated by rotation, to promote stable operation. The elimination of rotation would be an important advantage for electrodeless lamps in accordance with the invention. It should also be understood that other types of r.f. coupling modes, for example, capacitive coupling, may be used.

In an actual embodiment which was built in accordance with FIG. 6, the bulb diameter was about 23 mm inside diameter (ID) mm, the fill was comprised of 8 mg of Se and 50 torr of Ar, and the lamp was excited with about 180 watts of coupled r.f. power.

As is well known to those skilled in the art, the particular forms of the electrodeless lamp which are shown are exemplary only, and other specific shapes and types of cavities, for example, substantially all mesh type, as well as coupling modes which do not use a resonant cavity, for example, coaxial coupling modes, may be used.

As mentioned above, it appears that the performance indicators of the lamp of the invention are relatively good. In this regard it is noted that electrodeless lamps, which have heretofore been used mainly to produce ultraviolet as opposed to visible light, tend to maintain their lumen output at a high level for a longer period of time than arc lamps, and this may be an advantageous property of the electrodeless lamp embodiment of the present invention.

An additional advantage of the present lamp is that the primary radiating fill component may be a single element. Thus, the most common type of HID lamp presently used for high power illumination applications is the metal halide type HID lamp, wherein mercury is combined with the halide of another metal or metals in order to achieve the desired spectral output. A commonly used combination is Hg+ScI$_3$+NaI. The partial pressure of the additive metals is determined by the amount of metal halide in the lamp and by the temperature of the coldest spot on the lamp. The result is that variations in these parameters due to manufacturing tolerances or lamp aging will cause changes in the partial pressure of the additive, which in turn causes changes in the amount of output and in the spectral distribution of the output. On the other hand, since the present lamp may have only a single radiating fill component, or in accordance with an aspect of the invention have a fill which consists essentially of a sulfur containing substance or a selenium containing substance, and an inert gas, any effect caused by the partial pressures of different fill components changing at different rates will not occur.

A further advantage of the lamp of the invention is that it may emit principally molecular as opposed to atomic radiation which results in a smoother spectrum without peaks or abrupt transitions and possibly a better color rendering index. In this regard it is noted that non-metals have found little application as fill materials in the prior art, and one reason for this is that the primary atomic spectral lines of the non-metals do not lie in the visible region. However, the present invention, at least in certain implementations relies on molecular radiation as the dominant source, and is able to provide radiation principally within the visible range. A unique feature of the lamp of the present invention may be that it is a high luminous efficacy lamp which emits principally molecular radiation.

A still further advantage of the electrodeless lamp embodiment of the invention is that it is a compact, high power, visible radiator. Thus, the diameter of the bulb is typically only 2-3 cm, while outputs of about 140 lumens/watt (microwave of r.f. watts) or greater are possible.

While one advantage of the invention is that it provides a lamp which is capable of operating without using mercury, the addition of a small amount of mercury may help lamp starting. Additionally, for those applications where the presence of mercury is not considered to be a problem, it has been found that the addition of more mercury in amounts sufficient to increase lamp efficacy is an advantage.

For example, in a coaxially excited bulb of 5 mm ID (6 mm OD), having a volume of $6.5 \times 10^{-2}$ cc, a mercury dose of about 5 mg was added to a sulfur dose of about 0.33 mg, and 150 torr of argon. At 570 watts microwave input power input, the addition of the mercury resulted in an 11% improvement in efficacy, and had a significantly lower cooling requirement, which allows a less noisy pressurized cooling air source to be used. Such a lamp would be suitable for uses as a projection lamp.

In accordance with a further embodiment, xenon is used as the inert gas, and is present at partial pressure during operation which is less than but comparable to the sulfur partial pressure within an order of magnitude, or a partial pressure which is greater than the sulfur partial pressure. This arrangement results in increased efficacy.

For example, a bulb of 28 mm ID was filed with 24 mg of sulfur and 400 torr of xenon at room temperature. An increase in efficacy of 6% was realized over the case where 60 torr of argon was used as the inert gas.

The lamp of the invention finds use in general illumination applications. For example, the lamp may feed an end or both ends of a light pipe having apertures in it, through which the light exits, (e.g., FIG. 1 embodiment) or may be used in connection with a reflecting microwave cavity, or an external reflector for reflecting the light (e.g., FIG. 2 embodiment).

A particular use for the electrodeless lamp embodiment of the invention which does not fall into the general illumination category, is as a projection source, for example for high definition television. The bulb for such application may be quite small (e.g., 6 mm ID).

Figure 7:
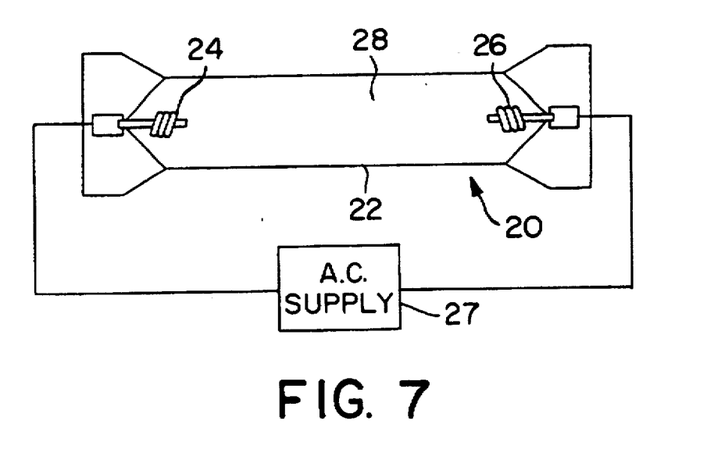

A further embodiment of the invention is shown in FIG. 7. This is an arc lamp 20 which is comprised of quartz envelope 22 having electrodes 24 and 26, and containing fill 28. To excite the fill, an A.C. voltage is impressed across the electrodes by A.C. supply 27, whereupon an arc discharge occurs therebetween.

In accordance with the invention, the fill in envelope 22 includes a sulfur containing substance or a selenium containing substance. In accordance with a further aspect of the invention, this fill substance is the primary radiating component in the fill. The substance may be elemental sulfur or selenium, or compounds of these elements. Additionally, a small amount of an additional gas to aid in starting is provided, which can be an inert gas, such as argon or xenon.

As in the case of the electrodeless lamp, the fill is present at a high pressure of at least about 1 atmosphere and preferably in the range of about 2-20 atmospheres. This pressure is controlled mainly by the sulfur or selenium containing substance, the partial pressure of which is at least about 1 atmosphere. Additionally, an electrical voltage is applied across the electrodes such that a power density of at least 60 watts/cm. exists. The electrodes 22 and 24 are made of or plated with a special material, to prevent chemical reactions with the fill gas which may lead to electrode deterioration. As mentioned above, the addition of mercury may improve operation.

In accordance with an aspect of the invention, the electrodes may be graphite rods. In a sulfur containing lamp, the reaction products of sulfur with the graphite rods would be CS and $CS_2$, which are very much less stable than their oxygen counterparts CO and $CO_2$, which are formed in a carbon arc lamp having consumable electrodes. The low-temperature stable product, carbon disulfide, is a clear volatile liquid. Reaction of sulfur with evaporated carbon to form carbon disulfide serves to keep the tube walls free of carbon deposits. The vaporization of the carbon disulfide returns the sulfur to the gas phase. Therefore, reaction with the electrode material will not deplete the gas phase of the radiating sulfur. Additionally, the decomposition of CS and $CS_2$ at the high temperature of the electrode tip serves to redeposit evaporated carbon on the electrode tip, establishing a chemical cycle which may enhance the longevity of the electrode.

Figure 8:
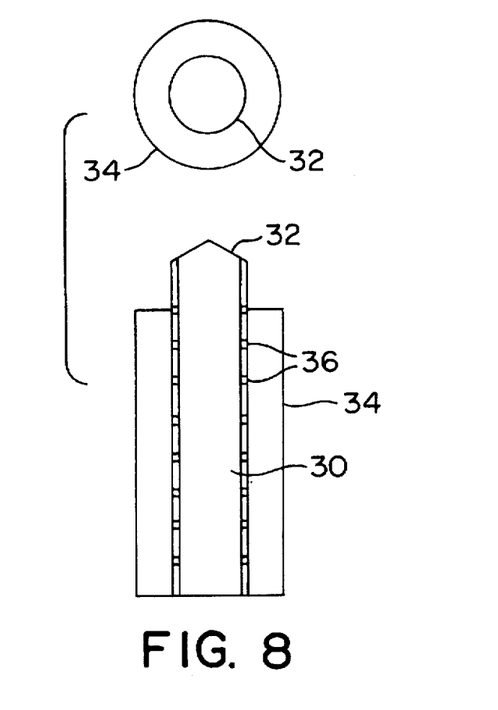
FIGS. 8 to 11 show arc electrode configurations.
Figure 9:
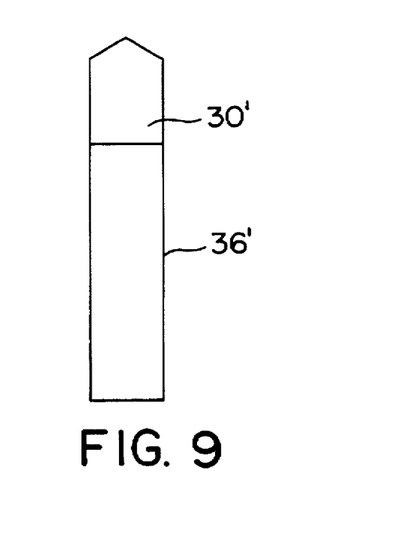

It is still necessary to protect the shank of the electrode, at lower temperatures, from reaction with the sulfur. FIGS. 8 and 9 illustrate two designs for protecting the low temperature shank of a graphite electrode from "tail erosion". In FIG. 8, graphite electrode 30 has an alumina sleeve 34 around its shank. Since graphite is likely to react with alumina at elevated temperatures, a barrier layer 36 of platinum is interposed between the graphite rod and alumina sleeve. The electrode tip 32 extends beyond the sleeve in that the alumina can only extend to the point at which the operating temperature is about 1500K.

In the embodiment of FIG. 9, the platinum barrier 36' by itself is used to prevent reaction between graphite and the bulb fill. The height of the platinum barrier layer is determined experimentally to limit the maximum temperature to which the platinum is exposed.

Figure 10:
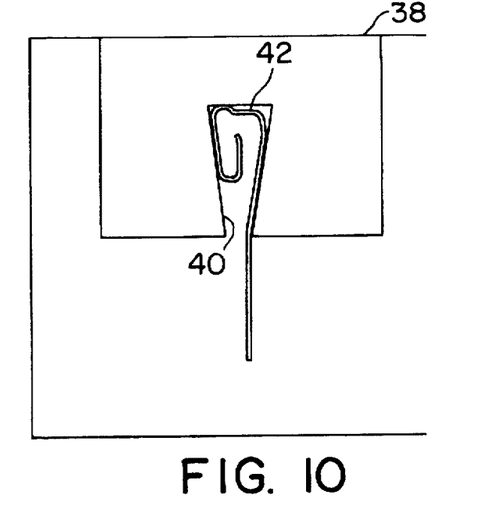

FIG. 10 shows how the graphite rod may be attached to a molybdenum sealing foil. The foil 42 (about 0.001" thick) is folded and slipped into a machined keyway 40 in the base 38 of the graphite rod. Since after sealing, the foil is under considerable tension due to the mismatch of expansion coefficient between quartz and molybdenum, it is pulled tightly into the wedge-shaped keyway. It will probably be necessary to platinize the end of the molybdenum foil, because fill gas can penetrate into the seal region as far as the end of the foil.

Figure 11:
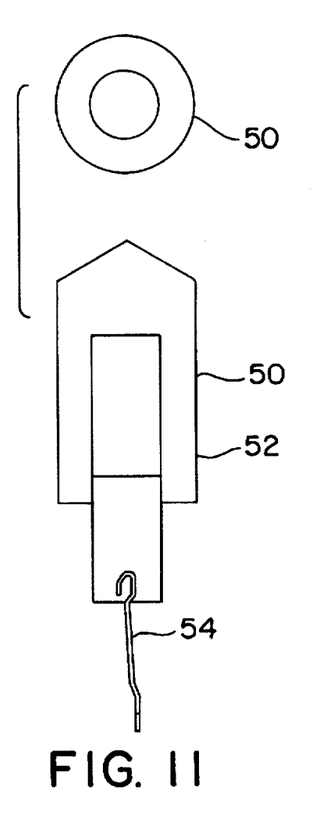

In accordance with a further aspect of the invention, "inert" electrodes which may be composed principally of refractory oxides may be used. These oxides will normally not be electrically conductive, and they must be made conductive by preparation in the form of a so-called "cermet", in which a blend of metallic particles and refractory oxide particles is pressed and centered into a refractory body. FIG. 11 shows a cermet electrode, wherein the cermet 50 is pressed around a platinized tungsten rod 52. The platinized tungsten support rod is fastened to the moly sealing ribbon 54 in the same manner as shown in FIG. 10. The platinum coating of the exposed tungsten rod shank serves to protect the tungsten from attack by the fill vapor. The cermet electrodes may incorporate thoria and molybdenum or tungsten, and electrodes incorporating a yttria-ruthenium combination are also known. In electrodes such as are shown in FIG. 11, the metal particles are shielded from reaction with the fill vapor by the refractory oxide, and the refractory oxide is more stable than the corresponding sulfide. Thus, reaction with, for example, sulfur vapor should be relatively small.

Alternatively, in accordance with the invention, electrodes of platinum, rhenium, or osmium may be used. Such electrodes may be fashioned of the metal in pure form, or the metal may be coated on a tungsten base.

The lamp electrodes may be coated with an electron emissive material, such as an alkaline earth sulfide (e.g. BaS). This reduces the effective electrode resistance, which leads to a reduction in the required ignition voltage and operating electrode losses. A tungsten electrode may be coated with alkaline earth sulfide material along its length from the sealed base to a point where the electrode becomes too hot during operation for stable tungsten/bulb fill material compounds to form.

In one implementation of the invention, the fill of either an electrodeless or arc lamp is arranged so that a sulfur or selenium containing substance is the sole radiating component in the bulb fill. In such an implementation, the sulfur or selenium containing substance may be the only substance in the fill except for a small amount of a gas to aid starting, e.g., argon or xenon.

Figure 12:
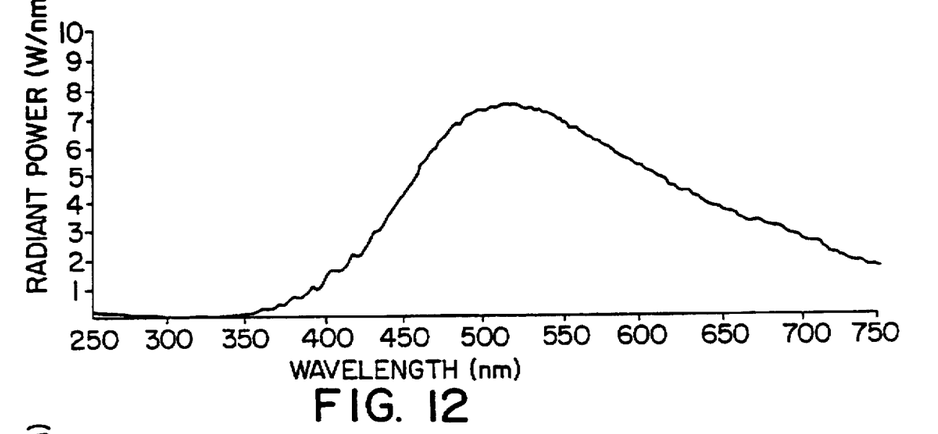
FIG. 12 is a spectral plot for an electrodeless lamp utilizing a sulfur bulb fill.

As a specific example of the invention, an electrodeless quartz bulb of spherical shape having an internal diameter of 2.84 cm was filled with 0.062 mg-moles/cc of sulfur, and 60 torr of argon. When the bulb was placed in a microwave cavity as described in connection with FIG. 1 and excited with microwave energy at a power density of about 280 watts/cc, visible light was emitted having a spectrum as shown in FIG. 12. The luminous efficiency of the lamp was about 140 lumens/watt (microwave). Additionally, it is noted from the spectrum that there is minimal UV radiation beneath 350 nm. This feature helps to increase the luminous efficacy of the lamp and also enhances the safety of the lamp, as UV radiation is a health hazard. It is also noted from FIG. 12 that the spectral plot is smooth and does not contain sharp peaks, which results from the fact that the lamp is principally a molecular as opposed to an atomic radiator.

Figure 13:
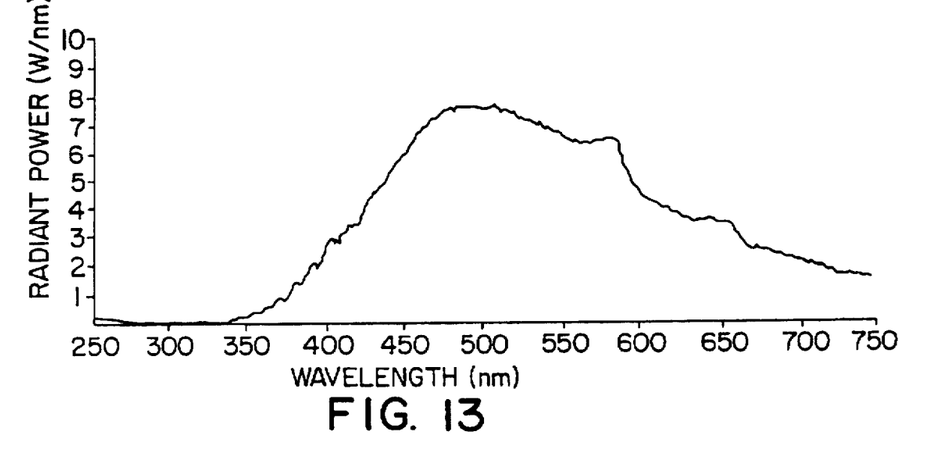
FIG. 13 is a spectral plot for an electrodeless lamp utilizing a bulb fill containing sulfur and cadmium iodide.

As a further specific example of the invention, an electrodeless bulb of spherical shape having an internal diameter of 2.84 cm was filled with 0.053 mg-moles/cc of sulfur, 0.008 mg-moles/cc of cadmium and 0.003 mg-moles/cc of cadmium iodide. When the lamp was excited with microwave energy in a cavity as described in connection with FIG. 1, at a power density of 280 watts/cc, visible light was emitted having a spectrum as shown in FIG. 13. The luminous efficacy of the lamp was about 134 lumens/watt (microwave). Additionally, it is noted that the spectrum has a shoulder at 580 nm, which is caused by the CdS and another shoulder at 650 nm, which is caused by the CdI.

As a further specific example, a spherical bulb of outside diameter 4.7 cm (wall thickness of 1.5 mm) was used. The applied power was 1100 watts in a cavity of the type shown in FIG. 2, the fill was sulfur at a concentration of 1.3 mg/cc. The average efficacy around the bulb was 165 lumens/watt (microwave). The ratio of the visible spectral power produced to the infrared spectral power was 10 to 1. As is typical in lamps of this general type, the fill included an inert gas, specifically 150 torr of argon.

Figure 14:
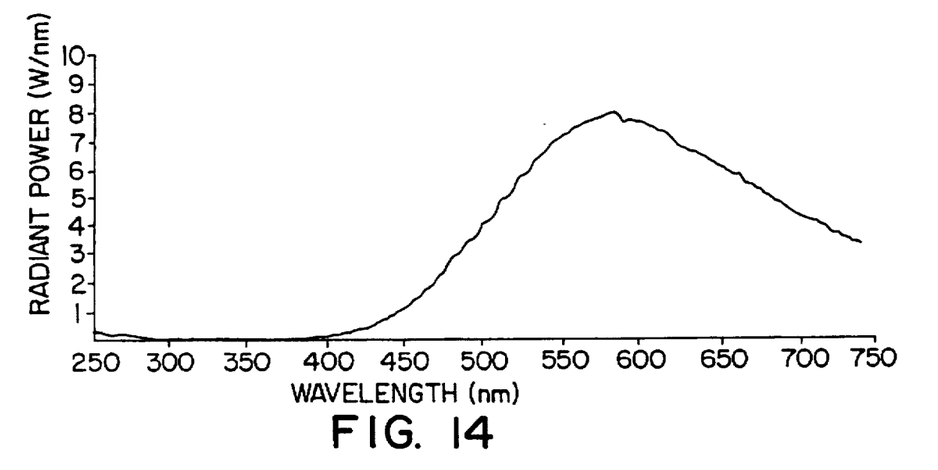
FIG. 14 is a spectral plot taken from a lamp utilizing a bulb fill containing selenium.

As a further specific example, an electrodeless quartz bulb having a volume of 12 cc was filled with 54 mg of selenium, resulting in $5.7 \times 10^{-5}$ mol/cc, and with 60 torr of argon. The bulb was placed in a microwave cavity as described in connection with FIG. 1, and excited with 3500 watts of microwave energy. A spectrum which was measured from the output of the bulb is shown in FIG. 14.

As a further example, a spherical bulb of diameter 40 mm OD (37 mm ID), was filled with 34 mg of Se, and 300 torr of xenon gas. The lamp was powered by 1000 microwave watts inside a resonant cavity of the type shown in FIG. 2. The average efficacy exceeded 180 lumens/watt (microwave).

Figure 15:
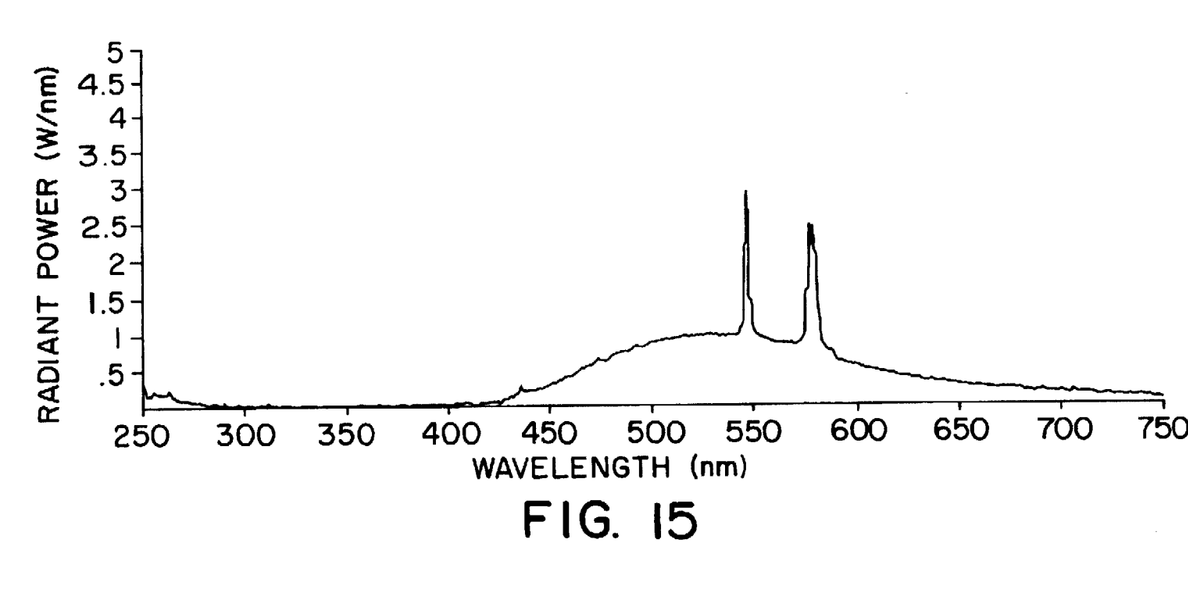
FIG. 15 is a spectral plot taken from an arc lamp utilizing a bulb fill containing selenium and mercury.

As a further example of the invention, an arc lamp bulb having a volume of 5 cc and an electrode spacing of 1 cm, was filled with 13.5 mg of Se, 20 mg of Hg, and 100 torr of argon. The lamp was excited with about 860 watts of A.C. power, and a spectrum as shown in FIG. 15 resulted. The electrodes were made of tungsten.

A new lamp which can be made without mercury has thus been disclosed. While the lamp has been described primarily as a high power visible source of illumination, certain implementations may find use in other areas of the spectrum, e.g., the U.V. Additionally, while the invention has been illustrated in accordance with specific embodiments, it should be understood that variations falling within the spirit of the invention will occur to those skilled in the art, and that the invention is to be limited only by the claims which are appended hereto and equivalents.

We claim:

1. An arc lamp bulb for emitting visible light, comprising,
 a light transmissive envelope which contains electrodes and which includes a fill wherein sulfur emits principally visible light upon excitation with sufficient power, wherein said electrodes are made of graphite.

2. An arc lamp bulb for emitting visible light, comprising,
 a light transmissive envelope which contains electrodes and which includes a fill wherein sulfur emits principally visible light upon excitation with sufficient power, wherein said electrodes are made of cermet which is comprised of refractory oxide particles and metal particles, wherein the metal particles are shielded from reaction with the sulfur in the fill by the refractory oxide particles.

3. The arc lamp of claim 2 wherein said principally visible light is molecular radiation.

4. An arc lamp bulb for emitting visible light, comprising, a light transmissive envelope which contains electrodes and which includes a fill wherein selenium, emits principally visible light upon excitation with sufficient power, wherein said electrodes are made of cermet which is comprised of refractory oxide particles and metal particles, wherein the metal particles are shielded from reaction with the selenium in the fill by the refractory oxide particles.

5. The arc lamp of claim 4 wherein said principally visible light is molecular radiation.

6. The arc lamp of claim 1 wherein said principally visible light is molecular radiation.

7. The arc lamp bulb of claim 6 wherein the shanks of the electrodes are covered with alumina.

8. The arc lamp bulb of claim 7 wherein there is a platinum layer between the graphite electrode and the alumina.

9. The arc lamp bulb of claim 6 wherein the shanks of the electrodes are covered with platinum.

10. The arc lamp bulb of claim 6 in combination with, means for exciting said fill with sufficient power to cause said sulfur to produce said principally visible light.

* * * * *